United States Patent [19]

Sherman et al.

[11] 4,312,694

[45] Jan. 26, 1982

[54] METHOD FOR FACILITATING PRINTSHOP PASTE-UP OPERATIONS

[76] Inventors: Paul L. Sherman; Kay Sherman, both of 5 Western Pl., East Brunswick, N.J. 08816

[21] Appl. No.: 766,604

[22] Filed: Feb. 7, 1977

Related U.S. Application Data

[63] Continuation of Ser. No. 586,900, Jun. 16, 1975, abandoned.

[51] Int. Cl.³ .............. A45D 42/14; B29C 17/00; B32B 31/04; B32B 31/24
[52] U.S. Cl. .................... 156/286; 156/300; 156/306.6; 156/308.2; 156/497; 248/362; 248/363; 356/401
[58] Field of Search ............ 156/285, 286, 300, 497, 156/542, 515, 583, 306.6, 308.2; 248/362, 363; 108/50; 356/401

[56] References Cited

U.S. PATENT DOCUMENTS

| | | | |
|---|---|---|---|
| 2,799,205 | 7/1957 | Bacsik | 248/363 |
| 2,993,824 | 7/1961 | Richardeau | 156/285 |
| 3,072,520 | 1/1963 | Groth | 156/286 |
| 3,130,101 | 4/1964 | Gittins et al. | 156/285 |
| 3,408,031 | 10/1968 | Muir | 248/363 |
| 3,446,162 | 5/1969 | Kranz | 108/50 |
| 3,658,014 | 4/1972 | Kranz et al. | 248/363 |
| 3,712,740 | 1/1973 | Hennings | 356/401 |

*Primary Examiner*—Jerome W. Massie
*Attorney, Agent, or Firm*—Howard E. Thompson, Jr.

[57] ABSTRACT

An improved approach to printshop paste-up operations involves a vacuum table having a grid of closely spaced air passage apertures in the top surface, a mounting member for receiving sheets carrying text and illustrative material comprising a sheet apertured to match the grid of said top surface having an imperforated border facilitating vacuum positioning on said top surfaces with apertures aligned, arranging and rearranging sheets of text and illustrative material on said mounting member while preventing unintended movement thereof by the vacuum effect at apertures covered thereby until desired composition is achieved, and then bonding a transparent plastic sheet over the mounting member and arranged sheets of text and illustrative material to provide an assemblage which is durable for transport, printshop use and extended storage. The expendable mounting members are provided in a number of standard sizes, and the vacuum table includes adjustable baffle means to confine effective vacuum to the size mounting member in use. In a preferred adaptation the vacuum table is superimposed on a light source and both the top surface and the mounting member are translucent, facilitating a combination of back lighting and incident lighting during such paste-up operations.

8 Claims, 9 Drawing Figures

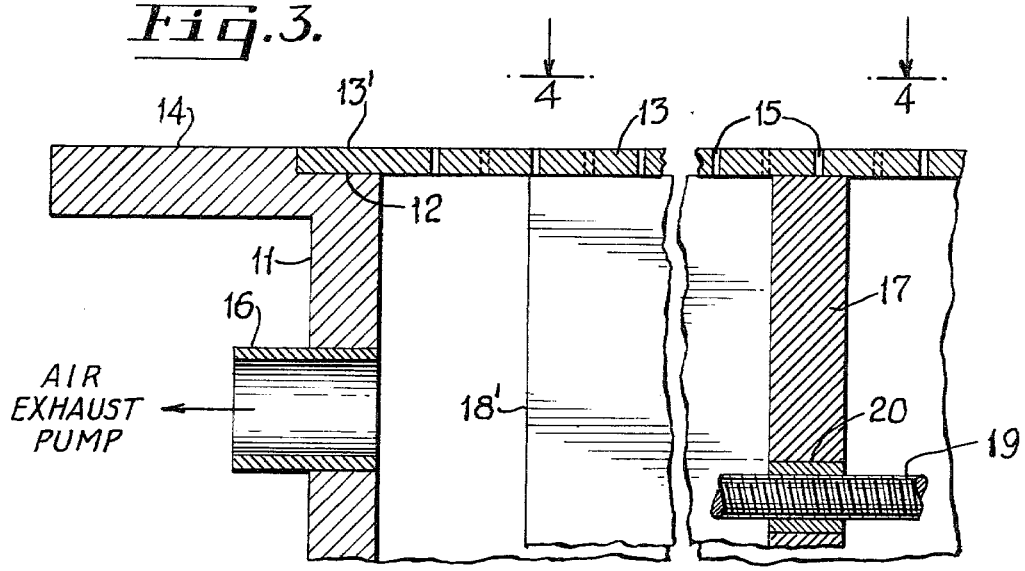
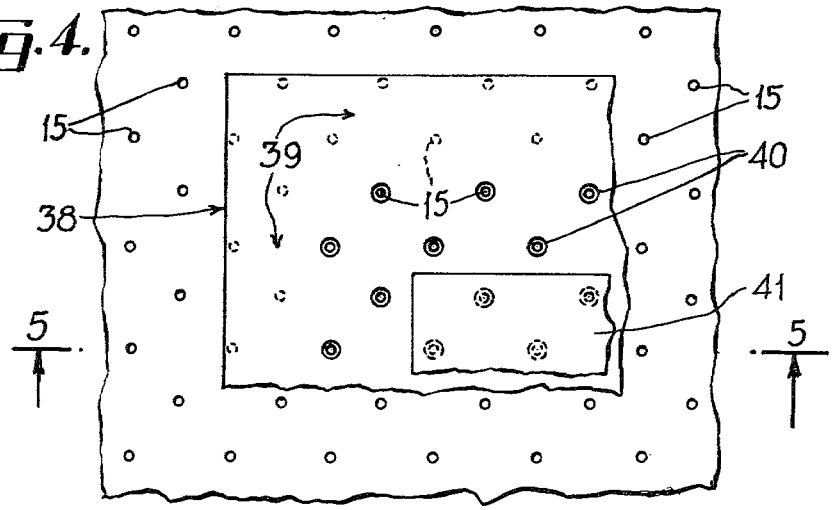
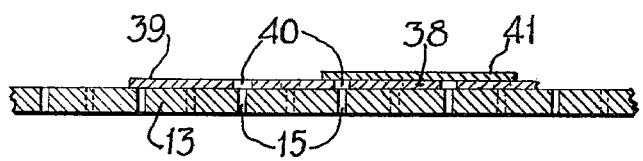
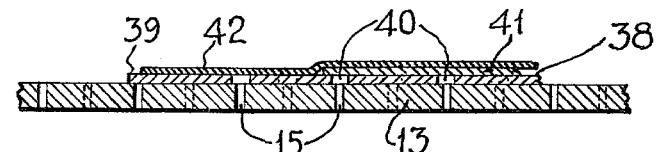
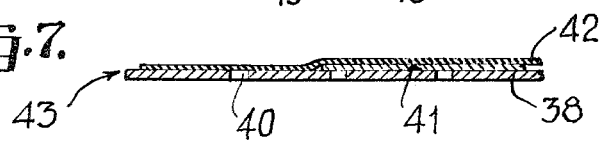

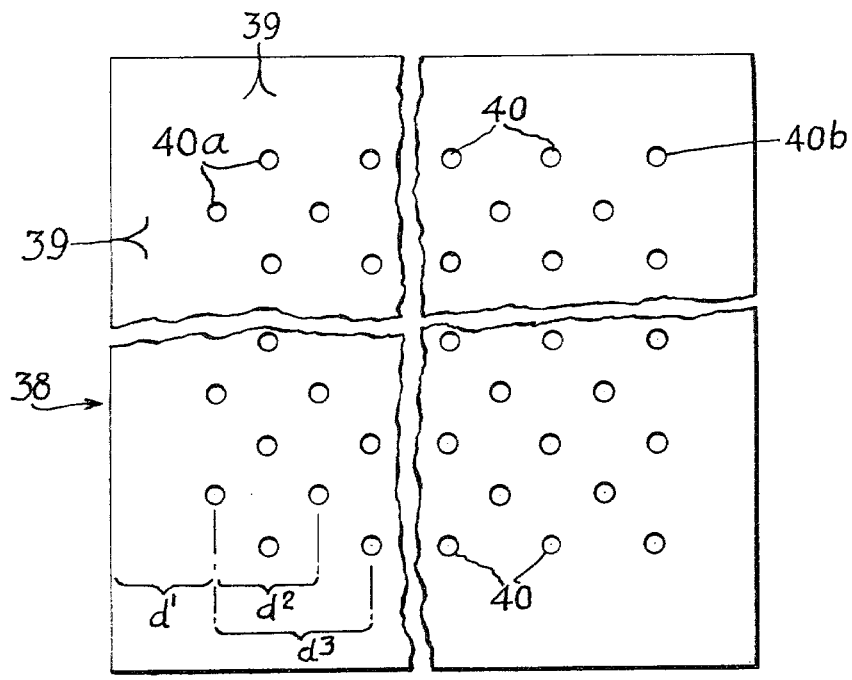
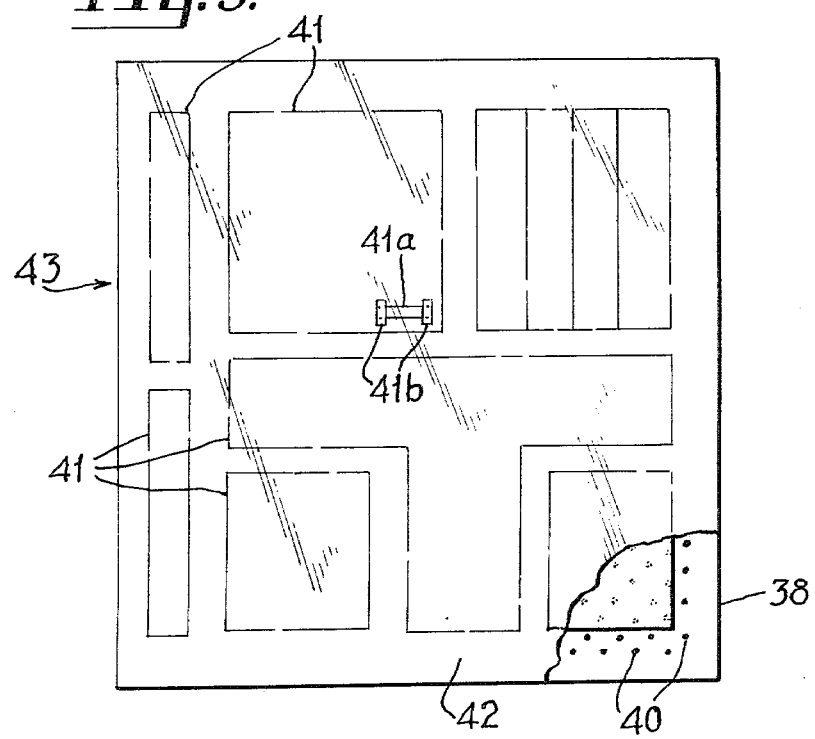

METHOD FOR FACILITATING PRINTSHOP PASTE-UP OPERATIONS

This is a continuation of application Ser. No. 586,900, filed June 16, 1975, now abandoned.

This invention relates to an improved approach to printshop paste-up operations involving a vacuum table having a grid of closely spaced air passage apertures in the top surface, a mounting member for receiving sheets carrying text and illustrative material comprising a sheet apertured to match the grid of said top surface having an imperforated border facilitating vacuum positioning on said top surfaces with apertures aligned, arranging and rearranging sheets of text and illustrative material on said mounting member while preventing unintended movement thereof by the vacuum effect at apertures covered thereby until desired composition is achieved, and then bonding a transparent plastic sheet over the mounting member and arranged sheets of text and illustrative material to provide an assemblage which is durable for transport, printshop use and extended storage. The expendable mounting members are provided in a number of standard sizes, and the vacuum table includes adjustable baffle means to confine effective vacuum to the size mounting member in use. In a preferred adaptation the vacuum table is superimposed on a light source and both the top surface and the mounting member are translucent, facilitating a combination of back lighting and incident lighting during such paste-up operations.

BACKGROUND OF THE INVENTION

In printshops employing primarily phototypesetting techniques, in contrast to the older, hot metal typesetting, the composition of printed pages of books, catalogues, newspapers and the like is controlled in what is referred to as a paste-up operation in which bits and pieces of text and illustrative material are organized and balanced in the manner desired in a printed page. It has been the practice to carry out this step by an individual pasting up of such bits and pieces on a suitable mounting member either by means of paste, glue or wax on the reverse side, or appropriately placed strips of transparent adhesive tape. The operation is inherently messy and time consuming when changes or repositioning of the bits and pieces becomes necessary. Furthermore, the bits and pieces of text and illustrative material, frequently only partially positioned, can easily be damaged during subsequent printshop operations, and the assemblage is poorly suited to extended storage. It is evident, therefore, that this widely used technique leaves much to be desired.

THE INVENTION

The improved approach to printshop paste-up operations in accordance with the present invention eliminates the messy, time consuming drawbacks of existing paste-up procedures and provides a combination of great freedom of locating and relocating bits and pieces of text and illustrative material until desired composition is achieved, and then forms a durable assemblage which can be safely and easily transported, used in printshop operations, and stored for extended periods if desired.

Basically the new approach involves the use of a vacuum table having a top working surface with a grid of closely spaced air passage apertures leading to an inner chamber in which reduced pressure or partial vacuum is achieved by a suitable air exhaust pump. A coacting component in the new approach comprises expendable, one-use blanks or mounting members, provided in different standard sizes, each having a grid of similarly spaced apertures throughout the major portion of the surface and an imperforated border. This border, suitably of a width to overlie two rows of apertures in the table top provides for peripheral anchoring of the mounting member when the apertures thereof are aligned with the table top apertures and the chamber is evacuated.

With the mounting member thus positioned, it is ready to receive bits and pieces of text and illustrative materials such as are conventionally brought together in a paste-up operation, but these bits and pieces are held in position by the suction created at a plurality of covered apertures. The vacuum support thus provided prevents accidental or unintended movement of arranged bits and pieces, but permits individual pieces to be lifted or peeled from the mounting member and repositioned as often as desired until satisfactory composition is achieved.

At this point an overlay of clear plastic sheeting is placed over the sub-assemblage and bonded to the mounting member and positioned bits and pieces of text and illustrative material. The plastic sheeting can be of the heat sealable type with bonding effected by application of appropriate heat and pressure; or, if desired, the mounting member and/or plastic sheeting can be precoated to provide a bonding therebetween upon simple application of pressure.

The durable assemblage thus obtained is ideally suited to subsequent photographing and other printshop operations. While uncovered apertures in the mounting member may create photographic images, these can readily be opaqued out in the intermediate white on black printing stage. Also, the mounting member can have a sheet of opaque material mounted behind it to eliminate photographic images of the apertures.

It is recognized that the use of a grid of air-passage apertures in a flat surface enclosing an evacuated chamber for the supporting of sheet materials is not basically new. In fact, the broad principle has been disclosed in a U.S. patent to Anander, U.S. Pat. No. 2,819,233 issued Nov. 26, 1957 (and now expired). No prior art is known, however, which suggests the coacting use of an apertured, bordered sheet temporarily associated with such a vacuum system, and adapted and intended to become permanently assembled with bits and pieces of text and illustrative material which have been vacuum positioned thereon.

As earlier mentioned, the apertured, bordered sheets or mounting members used in the new system, and which constitute a new article of commerce, are provided in different standard sizes appropriate for various books, catalogues, newspapers, and other printed objects. A cooperating feature of the vacuum table with which these blanks are used is a transversely adjustable baffle means which can vary the effective size of the vacuum chamber to correspond with the size blank or mounting member being used. Movement of the baffle can suitably be effected by a transverse threaded member, passing through a central threaded bushing in the baffle, and having a crank or other drive means at one end thereof.

In a preferred adaptation of the invention the back lighting of a typical light table can be provided by interposing the vacuum chamber between a translucent apertured table top and a translucent lower partition over a suitable light source. With such arrangement the blank or mounting member will preferably be formed of clear, transparent plastic and may have imprinted thereon column lines or other guides facilitating placement of bits of text and illustrative material. While the back lighting provided by the light table combination makes such imprinted lines or guides clearly visible, the operator will, nevertheless, rely primarily on incident light in arriving at desired composition in a paste-up.

Novel features of the invention will be more fully understood from a consideration of the following description having reference to the accompanying drawing in which equipment and materials utilized in the practice of the invention are illustrated with the various parts thereof identified by suitable reference characters in each of the views and in which:

FIG. 3 is a fragmentary sectional view taken substantially along the broken line 3—3 of FIG. 1.

FIG. 4 is a plan view of a portion of the table surface viewed in the direction of the arrows 4—4 in FIG. 3 with fragmentary portions of coacting members in accordance with the invention.

FIG. 5 is a fragmentary sectional view taken substantially on the line 5—5 of FIG. 4.

FIG. 6 is a view similar to FIG. 5 illustrating an overlay bonding together components resting on the tabletop.

FIG. 7 is a fragmentary sectional view similar to FIG. 6 showing the bonded assemblage removed from the tabletop.

FIG. 8 is a contracted plan view of an apertured blank for use with the vacuum table particularly illustrating the imperforated border portion thereof, and FIG. 9 is a plan view of an overall assemblage of the type shown in FIG. 7.

Figure 1:
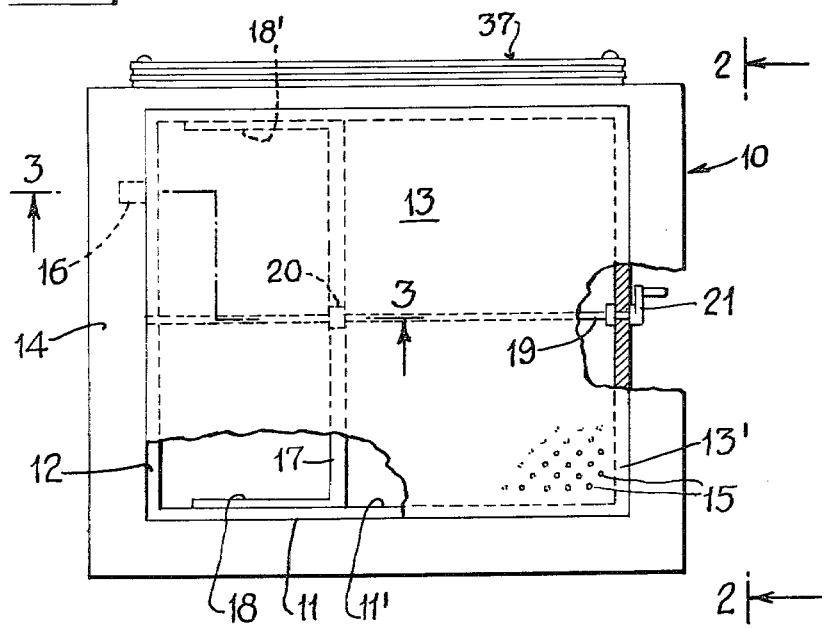
FIG. 1 is a plan view of the top of a vacuum table in accordance with the present invention with part of the structure broken away to show inner components.

As shown in the drawing, a vacuum table 10 in accordance with the present invention comprises a box-like enclosure of generally rectangular contour 11 having at the upper edge a peripheral recess 12 of a depth such as to receive an apertured plate 13 in a manner to be flush with a peripheral top frame 14. The top frame 14 suitably projects beyond the enclosure 11 on three sides of the table as shown in FIG. 1 to provide working surface and facilitate use of a T square at the sides and front of the table.

The entire area of the plate 13 with the exception of the narrow border portion 13' is provided with a grid of apertures 15 diagramatically shown in FIG. 1 and more clearly illustrated in FIGS. 3-6. These apertures provide for passage of air downwardly through the plate 13 as induced by a suitable vacuum pump coupled with an outlead 16 at one side of the enclosure 11.

As suction is needed only at such portion of the area of the plate 13 being utilized for a particular job, means is provided for adjustable baffling of the interior of the housing 11. This has been illustrated in FIGS. 1-3 of the drawing as comprising a vertical baffle 17 extending front to rear in the table and having alignment guides 18, 18' extending therefrom in the direction of the air outlead 16 and having slidable engagement with the inner surface 11' of the enclosure. Movement of the baffle 17 is provided by an elongated threaded member 19 extending perpendicularly of the baffle 17 at substantially the midpoint thereof and engaging a threaded bushing 20 therein. The threaded member 19 is rotatably supported at opposed sides of the enclosure 11 with means as indicated by the hand crank 21 extending outwardly of the enclosure 11 for rotating the threaded member and thereby adjusting location of the baffle 17. While such a hand crank will be appropriate for providing baffle adjustment in most instances, it will be understood that in larger tables, or in tables when baffle adjustment might be made quite frequently, it is within the scope of the invention to incorporate a reversible, motorized drive for actuating the threaded member 19.

The vacuum table can be one intended for use with incident light, in which event the apertured plate 13 can be fashioned from metal, opaque plastic, composition materials, and the like. In a preferred adaptation of the table, however, the apertured plate 13 will be formed of translucent plastic or the like permitting transmission of light from a light source within the enclosure 11, permitting the table to function as a modified light table.

Figure 2:
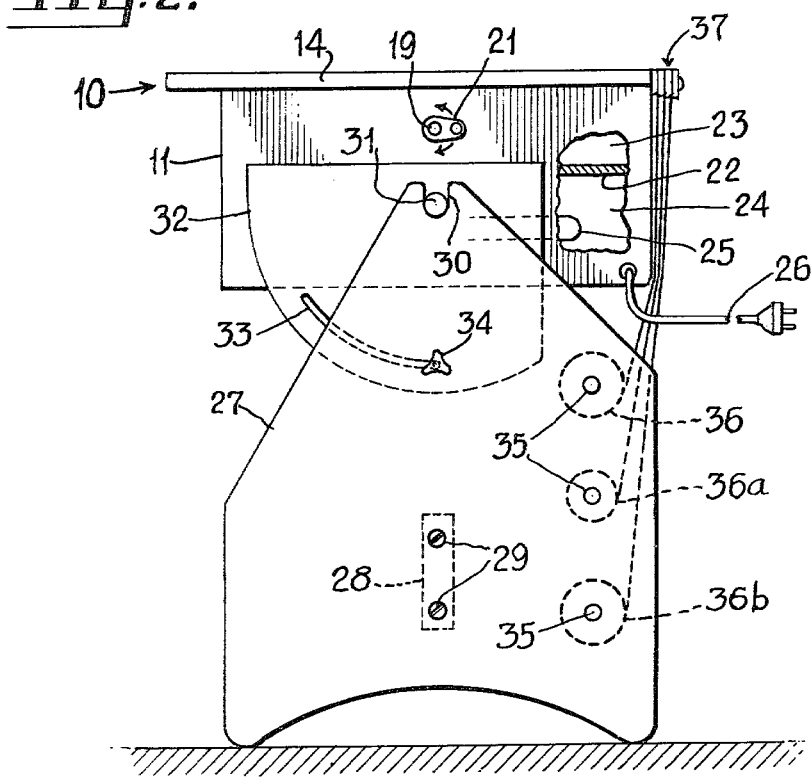
FIG. 2 is a side elevation view of the table taken in the direction of the arrows 2—2, with part of the structure broken away to show inner detail.

Such an adaptation is illustrated in FIG. 2 where the housing 11 has been shown as divided by a horizontal translucent plate 22 into an upper vacuum compartment 23 and a lower light compartment 24 having fluourescent or other light sources 25 actuated by a suitable electrical lead 26. In this adaptation it will be understood that the baffle 17 operates entirely within the vacuum chamber 23 and above the translucent plate 22.

In smaller adaptations of the vacuum table the housing 11 and associated components above described can constitute the entire assemblage with the intention of setting it on a suitable horizontal support. In larger and more versatile adaptations, however, the housing 11 is suitably associated with an appropriate base for supporting the upper surface at a desired working level and suitably facilitating angular adjustment of the upper surface. In FIG. 2 of the drawing such a base has been shown as comprising opposed side and leg members 27 aligned and assembled by a transverse spacing and brace member 28 and suitable screws or fasteners 29. Upper ends of the legs 27 are provided with notches 30 receiving protruding lugs 31 at opposite sides of the housing 11, providing pivotal support for the table assemblage 10. Table adjusting and clamping means is provided as by a template 32 secured to one or both sides of the housing 11 and having a curved cut-out 33, for which the center of curvature is the protruding lug 31, coacting with an adjustable clamp member 34 in the leg 27. The length of the cut-out 33 is suitably such as to permit the tabletop to be moved and clamped in various positions ranging from the horizontal to an inclination of about 45° to the horizontal.

The legs 27 at the rear portion of the assemblage are provided with a plurality of detachable transverse rods 35 for supporting spools of different width, plastic sheeting 36, 36a, 36b in a position to permit separate feed of the sheets through transverse guides 37 at the upper rear portion of the table assemblage 10 as shown. The function and purpose of the spools of plastic sheeting will be more fully hereinafter described.

In using the improved vacuum table for printing shop paste-up operations, a perforated blank or mounting member 38 having an imperforated border 39 is placed over a portion of the tabletop plate 13 adjacent the left border (as shown in FIG. 1) and the baffle 17 is adjusted to correspond with the width of the blank 38. The blank 38 has a grid of apertures 40 having on-center spacing and arrangement matching that of the apertures 15 in plate 13, but having diameters about 1.5 to 2.0 times the diameters of the apertures 15. The width of the border 39 should be such that when the apertures 40 are aligned with the apertures 15 at least two rows of apertures 15 will be covered by the imperforated border 39, thereby permitting the vacuum action to provide firm peripheral support of the positioned blank 38. To accomplish this, and having reference to FIG. 8, the distance $d^1$ from the blank edge to the first row of apertures 40 should be at least equal to the distance $d^2$ between the first and third rows of apertures 40, and preferably less than the distance $d^3$ between the first and fourth rows of apertures 40.

The provision of apertures 40 of slightly larger diameter than the apertures 15 serves two important functions. First, it facilitates positioning and aligning the blank 38 on the plate 13; but secondly, it enhances the vacuum action by increasing the area of sheet material overlying apertures 40 which is exposed to the reduced pressure within the baffled portion of the vacuum table.

The apertured blank 38 can be fashioned from opaque material such as heavy paper, thin cardboard, or opaque plastic sheeting, but in preferred adaptations of the invention, when the vacuum table is of the light table type as above described, the blank 38 is suitably formed of clear, transparent plastic sheeting such as clear polyester sheeting (MYLAR) or the like.

With suction applied to the enclosure thus supporting the properly oriented blank or mounting member 38 against the top plate 13 the assemblage is ready for "paste-up" operations. Having reference to FIGS. 4, 5 and 9, various sized sheets 41 carrying printed matter, photographs, art work or the like as components desired in the overall composition of a printed page are placed on the mounting member with each sheet 41 covering a plurality of the aligned apertures 15, 40. The difference between atmospheric pressure and the reduced pressure within the housing 11 creates a light holding force at each of the covered apertures sufficient to prevent accidental or unintended movement of the sheets 41. If the initial placement of sheets 41 is not as desired, however, these sheets can be easily lifted or peeled from the mounting member 38 and re-positioned as often as desired until the desired composition and balance is achieved as illustrated in FIG. 9. In final editing of the arrangement of sheets 41, it may be necessary to correct errors and the like by inserting small sheet sections 41a which can suitably be positioned by transparent adhesive tape 41b.

When satisfied with the arrangement and composition of the sheets 41, an overlay 42 of clear, flexible plastic such as vinyl sheeting is drawn from the appropriate roll 36, 36a or 36b to correspond with the width of the mounting member 38, and an appropriate length is cut off to extend the length of mounting member 38. The overlay sheeting 42 can be a heat sealable material such as vinyl plastic, in which event the application of appropriate heat and pressure effects a bonding together of the mounting member 38, sheets 41 and overlay 42 as an assemblage 43 such as shown in FIGS. 7 and 9 which can easily be lifted from the table 10 when the air pump has been turned off.

As an alternative to thus heat sealing the assemblage 43, the mounting member 38 and/or the overlay sheeting 42 can be treated or coated in a manner to provide adhesion therebetween upon contact and application of pressure. With either approach it will be apparent that the actual "pasting-up" becomes a quick final step after satisfactory composition has been achieved; and with either approach the assemblage 43 becomes a durable article for transport, use in other printing shop operations, and indefinite storage if desired.

In photographing the assemblage 43 it is possible that some images may be created by apertures 40 which remain uncovered, but these can easily be opaqued out at the intermediate white on black stage of photographically producing printing plates. By backing the assemblage with an opaque material such as paper or board, no aperture images will appear.

The perforated blank or mounting member 38 constitutes a new and expendable article or commerce in the practice of the invention. These mounting members 38 will be provided in a number of standard or custom sizes to correspond with individual or multiple pages of various books, catalogues, newspapers and the like. In some instances the members 38 may be imprinted with appropriate guides or characteristic portions of the printed page. Thus, for example, for newspaper paste-ups the members 38 may be imprinted with the lines which separate the several columns, thereby facilitating placement of the sheets 41 of text or illustrative material on the mounting member.

FIG. 8 shows two alternate ways of arranging apertures 40 on mounting member 38. At the left side as seen at 40a, the grid ends on the diagonal with no corner apertures, whereas at the right side the grid ends with corner apertures 40b. The 40a arrangement provides slightly greater corner hold-down of mounting member 38 and is therefore considered preferable where possible. It will be understood, however, that with the different size mounting members 38 the corner arrangement of apertures may be all type 40a, all type 40b, or a combination of the two types.

The combination vacuum and lighttable is particularly advantageous when using transparent mounting members 38 with printed guides, etc. as light passing through the table will make these clearly visible. Viewing of the sheets 41, however, will be dependent on incident light whether or not there may be light coming from within the table.

Various changes and modifications in the paste-up system and equipment as herein disclosed may occur to those skilled in the art, and to the extent that such changes and modifications are embraced by the appended claims, it is to be understood that they constitute part of the present invention.

What is claimed is:

1. The method of preparing printshop paste-ups that comprises:
   (a) providing a vacuum table having in a top surface thereof a grid of closely spaced air passage apertures,
   (b) arranging on said surface, while applying a vacuum causing air to be drawn downwardly through said aperture, a paste-up mounting member in the form of a sheet smaller than the apertured area of said table top having throughout its major portion a grid of apertures larger than and spaced to align with said air passage apertures and having an imperforated border of sufficient width to overlie two rows of said air passage apertures, then,
   (c) while continuing to apply said vacuum, arranging bits and pieces of text and illustrative sheet material on the apertured portion of said mounting member for retention by the suction hold created at apertures thereby covered, (d) rearranging said bits and pieces by lifting an individual bit or piece needing adjustment to break the suction hold and replacing the same until desired composition is achieved, then (e) placing over the subassemblage of vacuum supported bits and pieces on said mounting member a sheet of clear, transparent latently adherent plastic, (f) activating said latently adherent plastic by application of heat and/or pressure to thereby bond together as a paste-up assemblage said mounting member, the bits and pieces arranged thereon and said transparent plastic sheet, and then (g) discontinuing application of said vacuum to permit removal of said paste-up assemblage from the table.

2. The method as defined in claim 1 wherein said transparent plastic sheet is of a heat sealable type and is bonded to the subassemblage by application of heat and pressure.

3. The method as defined in claim 1 wherein said transparent plastic sheet carries a contact adhesive coating and is bonded to said subassemblage by application of pressure.

4. The method as defined in claim 1 wherein the apertures in said mounting member have diameters abou 1.5 to 2.0 times the diameter of said air passage apertures.

5. The method as defined in claim 1 wherein said mounting member is imprinted with lines and guides facilitating the placement and alignment of bits and pieces of text and illustrative material thereon.

6. The method as defined in claim 1 wherein said mounting member is formed of clear, transparent plastic material.

7. The method as defined in claim 1 wherein said vacuum table incorporates the functions of a light table by having a translucent top surface, a second translucent member parallel to and below said top surface, means for evacuating air from the space between said translucent members, baffle means extending front to rear of said table in the space between said translucent members, means for adjusting the location of said baffle means transversely of said space, and a light source below said second translucent member.

8. The method as defined in claim 1 wherein a vacuum chamber beneath said apertured surface has baffle means extending front to rear of said table, and means for adjusting the location of said baffle means transversely of the table to confine the application of vacuum to substantially the area covered by said smaller mounting member.

* * * * *